United States Patent [19]

Hartman et al.

[11] Patent Number: 4,523,961
[45] Date of Patent: Jun. 18, 1985

[54] METHOD OF IMPROVING CURRENT CONFINEMENT IN SEMICONDUCTOR LASERS BY INERT ION BOMBARDMENT

[75] Inventors: Robert L. Hartman, Warren; Louis A. Koszi, Scotch Plains, both of N.J.; Richard S. Williams, Panorama City, Calif.; John L. Zilko, Fanwood, N.J.

[73] Assignee: AT&T Bell Laboratories, Murray Hill, N.J.

[21] Appl. No.: 441,365

[22] Filed: Nov. 12, 1982

[51] Int. Cl.³ .................. H01L 21/225; H01S 3/00; H01S 3/06
[52] U.S. Cl. .................. 148/1.5; 29/576 B; 148/DIG. 84; 148/175; 148/187; 372/46
[58] Field of Search ........ 148/1.5, 175, 187, DIG. 84; 29/576 B; 372/46

[56] References Cited

U.S. PATENT DOCUMENTS

| | | | |
|---|---|---|---|
| 3,824,133 | 7/1974 | D'Asaro et al. | 148/1.5 |
| 3,895,965 | 7/1975 | MacRae et al. | 148/1.5 |
| 3,984,262 | 10/1976 | Burnham et al. | 148/172 |
| 4,071,383 | 1/1978 | Nagata et al. | 148/175 |
| 4,138,274 | 2/1979 | Dyment | 148/1.5 |
| 4,149,175 | 4/1979 | Inoue et al. | 357/17 |
| 4,157,497 | 6/1979 | Eisen et al. | 324/62 |
| 4,207,122 | 6/1980 | Goodman | 148/175 |
| 4,447,905 | 5/1984 | Dixon et al. | 372/46 |

FOREIGN PATENT DOCUMENTS 53-94336 2/1978 Japan.
53-19778 2/1978 Japan ................ 148/1.5

OTHER PUBLICATIONS

Dyment et al., J. Appl. Phys. 44 (1973) 207.
Millea e al., Thin Solid Films, 56 (1979) 253–266.
Kasahara et al., J. Appl. Phys. 51 (1980) 4119.
Dearnaley et al., Phys. Letts. 55A (1975) 201.
Okabayashi, Appl. Phys. Letts. 28 (1976) 490.
D. J. Mazey and R. S. Nelson, *Radiation Effects*, 1969, vol. 1, pp. 229–239.
W. T. Tsang and R. A. Logan, *Journal of Applied Physics*, May 1978, vol. 49 #5, pp. 2629–2638.
G. Carter and N. Grant, *Ion Implantation of Semiconductors*, 1976, pp. 160–163.

Primary Examiner—Upendra Roy
Attorney, Agent, or Firm—Lester H. Birnbaum

[57] ABSTRACT

A method of producing patternable resistive regions in III-V compound semiconductor devices and a resulting device structure having improved current characteristics. III-V semiconductor substrates are irradiated with inert ions to produce a resistive region therein. At least one epitaxial layer is grown over the substrate while maintaining the resistive characteristics within the substrate. A second resistive region is then formed in at least the top epitaxial layer. This second resistive region is aligned with the first one in order to minimize current spread through the device.

14 Claims, 4 Drawing Figures

METHOD OF IMPROVING CURRENT CONFINEMENT IN SEMICONDUCTOR LASERS BY INERT ION BOMBARDMENT

BACKGROUND OF THE INVENTION

This invention relates to III-V semiconductor devices and in particular to improvements in the current confinement in such devices.

Semiconductor devices known in the prior art comprise several layers of III-V semiconductors. It is often desirable to form areas of high resistivity within certain layers so as to define conducting stripes for current flow. Such is the desire in many semiconductor lasers.

A basic structure of the semiconductor laser is the double heterostructure (DH) which typically includes an n-type GaAs substrate, and a layer of low-refractive-index, high bandgap n-type AlGaAs deposited onto the substrate. Upon this layer, a thin layer of high-refractive-index, low bandgap GaAs or AlGaAs is formed followed by a layer of low-refractive-index, high bandgap p-type AlGaAs. The thin, high-refractive-index GaAs or AlGaAs layer is referred to as the "active" layer. It is this layer in which the stimulated emission occurs.

In order to obtain high efficiency from such a device, the active volume must be kept very small. The higher bandgap layers confine the carrier recombination in the vertical direction by trapping the carriers in the lower bandgap active layer. By constructing the device such that the active layer is very thin, one can minimize the active area in one dimension. However, other techniques must be utilized in order to laterally confine the active volume.

In the design of lasers of the foregoing type, several methods have been used for lateral current confinement. One such method involves the bombardment of the top epitaxial layers with protons in order to form resistive regions therein which laterally confine current to a semiconductive stripe. By narrowing the stripe, one can make the active region narrow. This type of structure is generally known from U.S. Pat. No. 3,824,133 issued to D'Asaro et al, July 16, 1974. However, due to the lack of strict lateral current confinement in all layers, such a structure tends to produce a light beam in which the lateral position of the light output along the active layer varies. This can be an undesirable feature for certain applications of lasers, for example, in trying to guide the beam through an optic fiber.

Also known in the prior art is the idea of fabricating narrow conducting stripes at the substrate -n ternary layer interface. W. T. Tsang and R. A. Logan reported on such a structure in their article, "Lateral-Current Confinement in a GaAs Planar Stripe Geometry and Channeled Substrate Buried DH Laser Using Reverse-Biased p-n Junctions", which appeared in the *Journal of Applied Physics,* May 1978, Vol. 49, page 2629. This scheme involves the formation of a p-type layer on an n-type substrate, then etching channels through the p-type layer into the n-type substrate. Another n-type layer is grown over the p-type layer and into the channels, thus forming p-type regions between the n-type layer and substrate. This causes the boundaries of the p-type regions to act as blocking junctions thereby defining narrow conductive stripes in the channel regions. However, this current confinement scheme requires two separate growth procedures to form the epitaxial layers, separated by fabrication steps to form the blocking junctions.

Another method for confining current which involves the formation of p-type regions between n-type layers is generally known from U.S. Pat. No. 3,984,262 issued to Robert Burnham and Donald Scifres. This patent involves the formation of resistive regions in a diode laser by diffusion of an impurity into a substrate of a selected conductivity type so as to form secondary p-n junctions defining a conductive stripe, with subsequently formed epitaxial layers providing a primary p-n junction at the boundary of the active laser region. Forward biasing of the primary p-n junction results in reverse biasing of the secondary p-n junctions, and current is confined to the stripe. However, during the subsequent growth of the epitaxial layers for such a device, dopants tend to diffuse in the lateral direction and vertical direction, thereby making it difficult to define a current confining stripe. Further, because epitaxial growth temperatures tend to be equal to or greater than diffusion temperatures, the dopants may diffuse upward faster than the layers can be grown, thereby making it difficult to maintain primary p-n junctions.

Accordingly, it is the primary objective of the present invention to provide a III-V semiconductor device with controlled current confinement.

Another objective of the present invention is to provide a technique which allows for the fabrication of III-V semiconductor devices with controlled current confinement.

SUMMARY OF THE INVENTION

These and other objects are achieved in accordance with the present invention which in one aspect is a III-V semiconductor device comprising a semiconductor substrate with a first resistive region formed in the surface to define a first semiconductive stripe. A plurality of epitaxial layers is formed over the substrate and a second resistive region is formed in the surface of at least the top epitaxial layer to define a second semiconductive stripe therein. The two stripes are aligned such that current applied through the device is substantially confined to the width of the stripes.

In accordance with another aspect of the present invention, a method for fabricating a III-V semiconductor device includes irradiating the substrate with inert ions to form a resistive region and growing at least one epitaxial layer over the substrate. In accordance with a further feature, a second resistive region is formed in at least the top epitaxial layer to define a second conductive stripe which is aligned with the first stripe. Alignment is achieved by leaving on the substrate edge portions of the mask utilized to form the first resistive region.

BRIEF DESCRIPTION OF THE DRAWINGS

These and other features of the invention are delineated in detail in the following description. In the drawing.

DETAILED DESCRIPTION

The current confinement scheme of the present invention is illustrated here in a GaAs double heterostructure laser. However, it is apparent that the invention can be utilized in other III-V semiconductor devices where the formation of resistive regions is desired.

Figure 1:
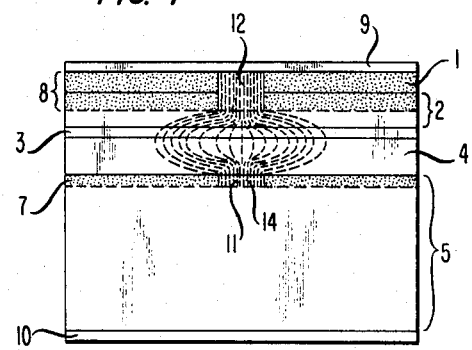
FIG. 1 is a cross-sectional view of a device in accordance with one embodiment of the invention.

FIG. 1 shows a cross-sectional view of a III-V semiconductor laser according to one embodiment of the present invention. The multi-layer structure comprises an n-type GaAs substrate, 5, whose impurity concentration is about $1 \times 10^{18} cm^{-3}$, upon which successive epitaxial layers were grown. The first layer was an n-type $Al_xGa_{1-x}As$ layer, 4, which was about $2\mu$ thick with x approximately equal to 0.39 and doped with Te to a concentration of about $5 \times 10^{17} cm^{-3}$. Grown thereon was an undoped $Al_yGa_{1-y}As$ active layer, 3, which was approximately $0.15\mu$ thick, with y approximatley equal to 0.05. (This layer could be doped if desired.) Formed on the active layer was a p-type $Al_zGa_{1-z}As$ layer, 2, with z approximately equal to 0.38 and a thickness of approximately $1.5\mu$. This layer was doped with Ge to a concentration of about $2 \times 10^{17} cm^{-3}$. Formed on this layer was a p-type GaAs layer, 1, with a thickness of about $0.6\mu$ and doped with Ge to a concentration of approximately $2 \times 10^{18} cm^{-3}$.

The combination of a relatively low bandgap compound in the active layer, 3, and a relatively high bandgap compound in layers 2 an 4, restricts the carrier recombination to the active layer 3.

In such devices, lateral current confinement is desirable to achieve optimum light characteristics. Such curent confinement is achieved in accordance with the invention by formation of resistive regions in the substrate and in at least the top epitaxial layer. Referring again to FIG. 1, the first resistive region 7 is shown in the substrate 5 and is typically formed by ion implantation. Inert ions, such as Ne, have been found to be particularly effective since they do not react with the substrate. A second resistive region 8 was formed through the top epitaxial layer 1 and into a portion of layer 2. This region is typically fomed by proton bombardment.

Each resistive region 7 and 8 defines a semiconductive stripe, 11 and 12 respectively, for passage of current therethrough. The stripes are aligned as closely as possible in the horizontal direction so when a potential is applied across the device by use of the two electrodes 9 and 10, the current flow is substantially confined to the areas of the stripes.

The ion implanted substrate laser having the above structure and characteristics may be fabricated in a manner as will be described below.

Figure 2:
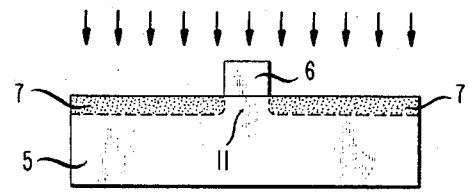
FIG. 2 is a cross-sectional view of the device of FIG. 1, during one stage of fabrication.

Referring now to FIG. 2, typically lasers are built up from a rectangular substrate of GaAs 5. The substrate was first cleaned and etched in the usual manner in order to ensure the elimination of polishing damage. A layer of $SiO_2$, 6, was formed photolithographically over the surface of the substrate, 5, to mask the area of the substrate which will comprise the semiconductive stripe 11. The mask was a continuous stripe approximately 5,000 Angstroms thick and measured approximately $5\mu$ wide.

The substrate was then irradiated with Ne atoms, as illustrated by the arrows, having an energy of approximately 250 keV at a dose of approximately $8 \times 10^{14} cm^{-2}$ to form the resistive region, 7, with a resistivity of about $10^5-10^6$ ohm-cm, which defined the first semiconductive stripe 11. Preferably, the resistivity should be in the range from $10^2$ to $10^{14} \Omega$-cm. Irradiation under these conditions produced a damage resistive layer, 7, about $0.3\mu$ in depth, which remained a single crystal structure thus allowing for subsequent LPE growth. Generally an irradiation dose of ions of at least $10^{10} cm^{-2}$ is necessary to insure the formation of an adequate resistive region. However, an irradiation dose exceeding $10^{18} cm^{-2}$ could damage the crystal structure and may cause problems when trying to form subsequent epitaxial layers. Energies for the ion implantation should range from 100 to 1,000 keV.

Figure 3:
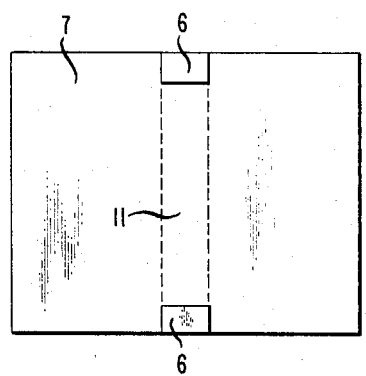
FIG. 3 is a top view of the device of FIG. 1 during another stage of fabrication.

The high resistivity of region 7 was maintained during substrate bakeout and LPE growth, with substrate bakeout temperatures of about 830 degrees C. for approximately 15 hours. The bakeout is desirable prior to LPE growth in order to minimize the impurity concentration within the growth solution. In the next step, as shown in the top view of FIG. 3, the major portions of the $SiO_2$ stripes were chemically removed by standard means leaving only portions at the edges of the substrate for reasons which shall later become apparent. In this example, a wax mask protected the edge portions and the rest of the $SiO_2$ mask was removed by a buffered HF solution. The substrate surface was then cleaned by standard procedures but not etched so that none of the high resistance region near the surface was removed.

Figure 4:
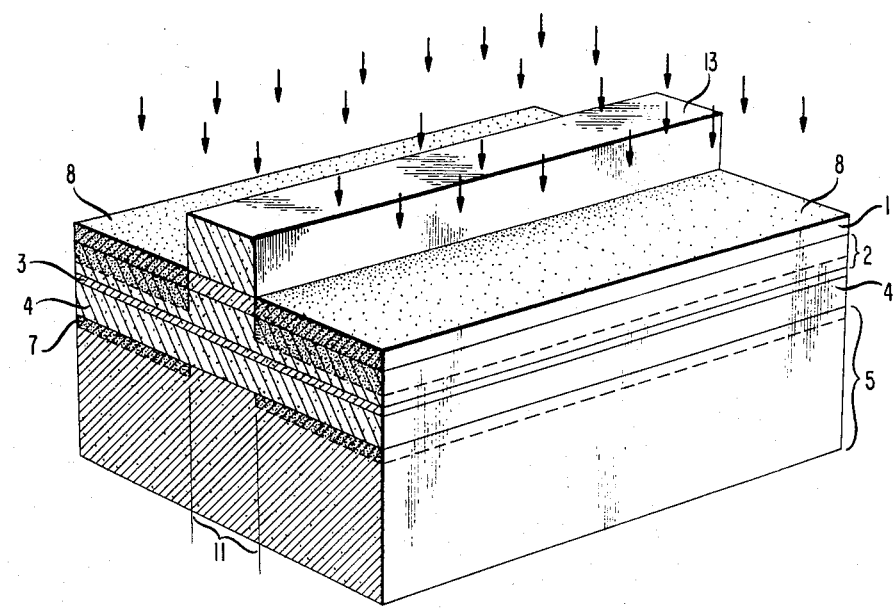
FIG. 4 is a perspective, cut away view of the device of FIG. 1 during another stage of fabrication.

Referring now to FIG. 4, the four epitaxial layers 4, 3, 2, and 1 were successively formed over the substrate 5 by liquid phase epitaxy using the source seed method starting at 780 degrees C. (It will be noted that the edge portions of the wafer which included the remaining portions of mask 6 have been cut away for the purposes of illustration). A melt of GaAs was prepared by saturating a solution of pure Ga with GaAs. Also prepared was an AlGaAs melt which was made by saturating pure Ga with AlGaAs. The substrate was then placed under the melts and the melt temperatures were lowered , thereby forming super saturated solutions and causing the GaAs or the AlGaAs to precipitate out of the solution and form a layer on the substrate. The growth of layer 4 was carried out by cooling the AlGaAs melt 0.1 degrees C./min. for 30 minutes and 0.03 degrees C./min. for 30 minutes resulting in a layer approximately $2.5\mu$ thick. The thickness of layer 4 is preferably between 1 and $3\mu$. The next layer 3 was formed at a melt cooling rate of 0.03 degrees C./min. for 35 seconds. The preferred thickness of the layer is less than $0.4\mu$. The next layer 2 was formed by cooling the AlGaAs melt 0.03 degrees C./min. for 5 minutes and 0.1 degrees C./min. for 22 minutes. The preferred range for the layer thickness is between 1.2 and $1.8\mu$. The final epitaxial layer 1 was grown at a melt cooling rate of 0.1 degrees C./min. for 5 minutes. Preferably this growth results in a layer with a thickness ranging from 0.4 to $0.8\mu$.

The resistive region 7 remained essentially unaffected, with a final resistivity of approximately $10^5-10^6$ ohm-cm, in spite of the high temperatures required for liquid phase epitaxial growth and substrate bakeout. In general, an initial temperature of at least 750 degrees C. is needed for liquid phase epitaxial growth and a temperature of at least 825 degrees C. for at least 12 hours is needed for bakeout. However if the resistive region is subjected to temperatures exceeding 890 for more than 16 hours, the implanted ions tend to diffuse out of the substrate thereby reducing its resistivity. The resistivity of region 7 should be at least $10^2$ ohms-cm after epitaxial growth for adequate current confinement. If molecular beam epitaxy is employed, a minimum temperature of approximately 550 degrees C. is desirable.

After the last LPE layer was formed, as shown in FIG. 4, an $SiO_2$ mask 13 was photolithographically formed over the top layer to a thickness of approximately 1.5$\mu$ and aligned with the $SiO_2$ masking remaining from the first mask, 6, which is still exposed at the wafer edges since no growth of GaAs or AlGaAs occurs on $SiO_2$. The top layer was then bombarded with protons, illustrated by the arrows, at an energy of 150 keV and a dose of $3 \times 10^{15} cm^{-2}$ to form a second resistive region, 8, therein, thereby defining a second semiconductive stripe 12. The dosage of protons should fall preferably in the range from $10^{10} cm^{-2}$ to $10^{19} cm^{-2}$, using energies ranging from 20 to 2,000 keV in order to insure adequate resistivity along with minimal crystal damage. The proton implant mask 13 and the remaining portions of the ion implant mask 6 were then chemically removed using standard procedures.

Referring back to FIG. 1, electrodes 9 and 10 were placed on the top and bottom of the device. When an electric current density is applied through electrodes 9 and 10, the device emits a laser beam.

Although the invention has been described in terms of a double heterostructure laser, it should be apparent that it is applicable to any semiconductor device including at least one epitaxial layer where current confinement is a significant factor in the operation of the device. Further, although use of Ne ion implantation is particularly useful for forming the resistive region in the substrate, other inert ions such as He, Ar, Kr, Xe and Rn may be employed in certain applications.

Various additional modifications of the invention will become apparent to those skilled in the art. All such variations which basically rely on the teachings through which the invention has advanced the art are properly considered within the spirit and scope of the invention.

What is claimed is:

1. A method for fabricating a III-V compound semiconductor device comprising the following steps:

forming a resistive region within a III-V semiconductor substrate by irradiating said substrate with ions selected from the group consisting of He, Ne, Ar, Xe and Rn; and growing at least one III-V semiconductor epitaxial layer on said substrate such that a minimum resistivity of the ion implanted region is retained.

2. The method of claim 1, wherein said resistive region is formed in order to define a semiconductive stripe.

3. The method of claim 1, wherein said III-V compound semiconductor comprises a compound containing Ga.

4. The method of claim 1, wherein said substrate is irradiated with ions with a dose in the range of $10^{10} cm^{-2}$ to $10^{18} cm^{-2}$.

5. The method of claim 1, wherein said ions comprise neon.

6. The method of claim 1, wherein the substrate comprises n-type GaAs, said epitaxial layer comprises an n-type AlGaAs layer, and upon said layer are grown successively additional epitaxial layers comprising an AlGaAs active layer, a p-type AlGaAs layer and a p-type GaAs layer.

7. The method according to claim 1, wherein the epitaxial layers are grown at an initial temperature of at least 550 degrees C.

8. The method according to claim 1 wherein the resistivity of the ion implanted region is at least $10^2$ ohms-cm after growth of the epitaxial layer.

9. The method of claim 3, wherein said compound containing Ga is selected from the group consisting of GaAs, AlGaAs, and GaP.

10. The method of claim 6, wherein a second resistive region is formed in at least the top epitaxial layer defining a second semiconductive stripe which is aligned with the first stripe.

11. The method according to claim 6 wherein the resistivity of the ion implanted region is at least $10^5$ ohms-cm after growth of all epitaxial layers.

12. The method of claim 10, wherein the second resistive region is formed by bombardment with protons at a dose in the range of $10^{10} cm^{-2}$ to $10^{19} cm^{-2}$.

13. The method according to claim 10, wherein the first semiconductive stripe is defined by means of a mask layer formed on the surface of the substrate during the irradiation, portions of said mask are left on the substrate during the growth of the epitaxial layers, and the second semiconductor stripe is defined by a second mask layer formed on the top epitaxial layer which is aligned with the portions of the first mask layer remaining on the substrate.

14. The method of claim 7, wherein prior to growth of the epitaxial layers the resistive region within the substrate is subjected to a temperature of at least 825 degrees C. for a minimum of 12 hours.

* * * * *